May 9, 1967 SEENING YEE 3,319,086
HIGH SPEED PULSE CIRCUITS
Filed Feb. 11, 1965 2 Sheets-Sheet 1

INVENTOR.
SEENING YEE
BY
S. C. Yeaton
ATTORNEY

INVENTOR.
SEENING YEE
BY
ATTORNEY

United States Patent Office 3,319,086

Patented May 9, 1967

3,319,086

HIGH SPEED PULSE CIRCUITS

Seening Yee, Whitestone, N.Y., assignor to Sperry Rand Corporation, Great Neck, N.Y., a corporation of Delaware Filed Feb. 11, 1965, Ser. No. 431,885
2 Claims. (Cl. 307—88.5)

Figure 1:
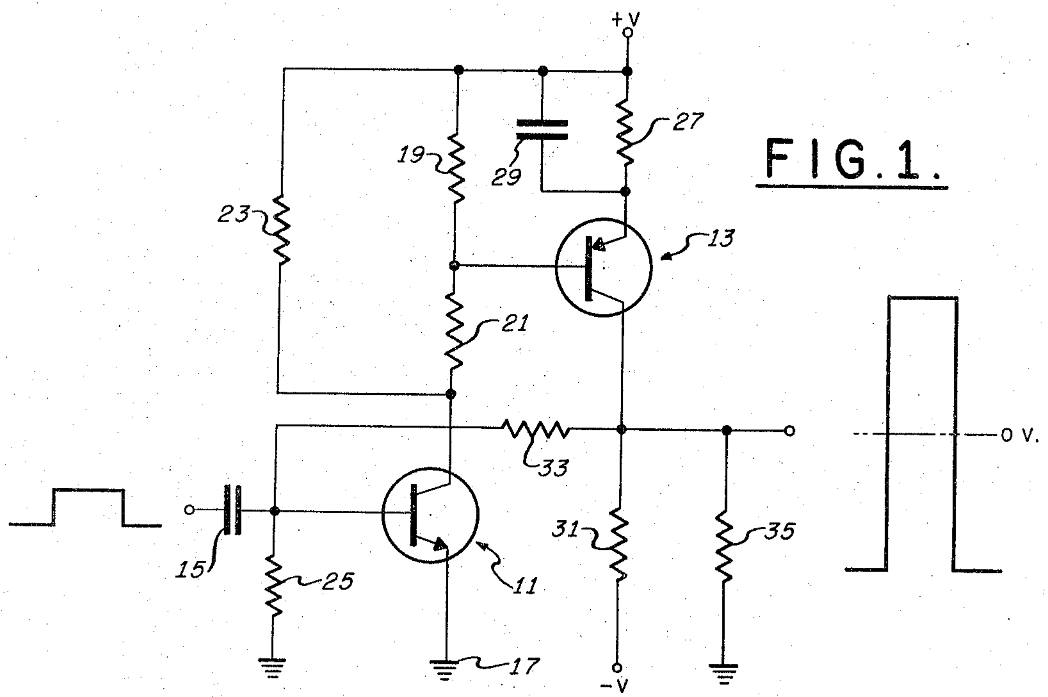

This invention relates to pulse amplifiers and more specifically to pulse amplifiers employing pairs of junction transistors displaying complementary symmetry.

Pulse amplifiers employing complementary symmetry transistors are known in the art. These amplifiers, however, are limited in the speed at which they can react to rapidly changing input signals.

Furthermore, many of these prior art circuits are limited in stability in that the output wave shape is influenced by a change in the transistor characteristics.

It is an object of the present invention to provide a complementary symmetry pulse amplifier which has an extremely high switching speed.

It is another object of the present invention to provide a complementary symmetry pulse amplifier having an output pulse of closely controlled amplitude and duration.

It is still another object of the present invention to provide a complementary symmetry pulse amplifier that has an output wave shape which is essentially independent of the transistor characteristics.

These and other objects are achieved according to the principles of the present invention by employing at least one pair of complementary symmetry transistors and providing an auxiliary network that minimizes the charge-discharge time of the internal capacitances associated with the transistors.

An understanding of the invention may be obtained from a study of the following discussion.

Figure 2:
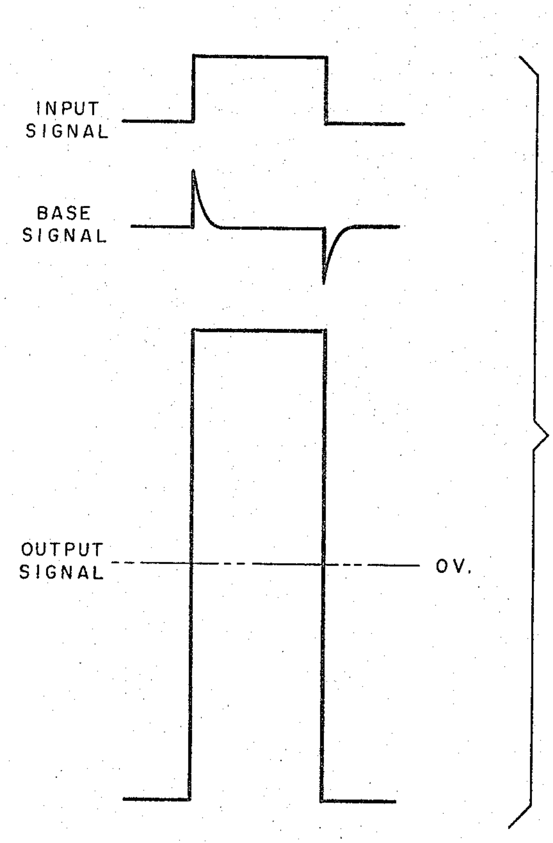
Figure 3:
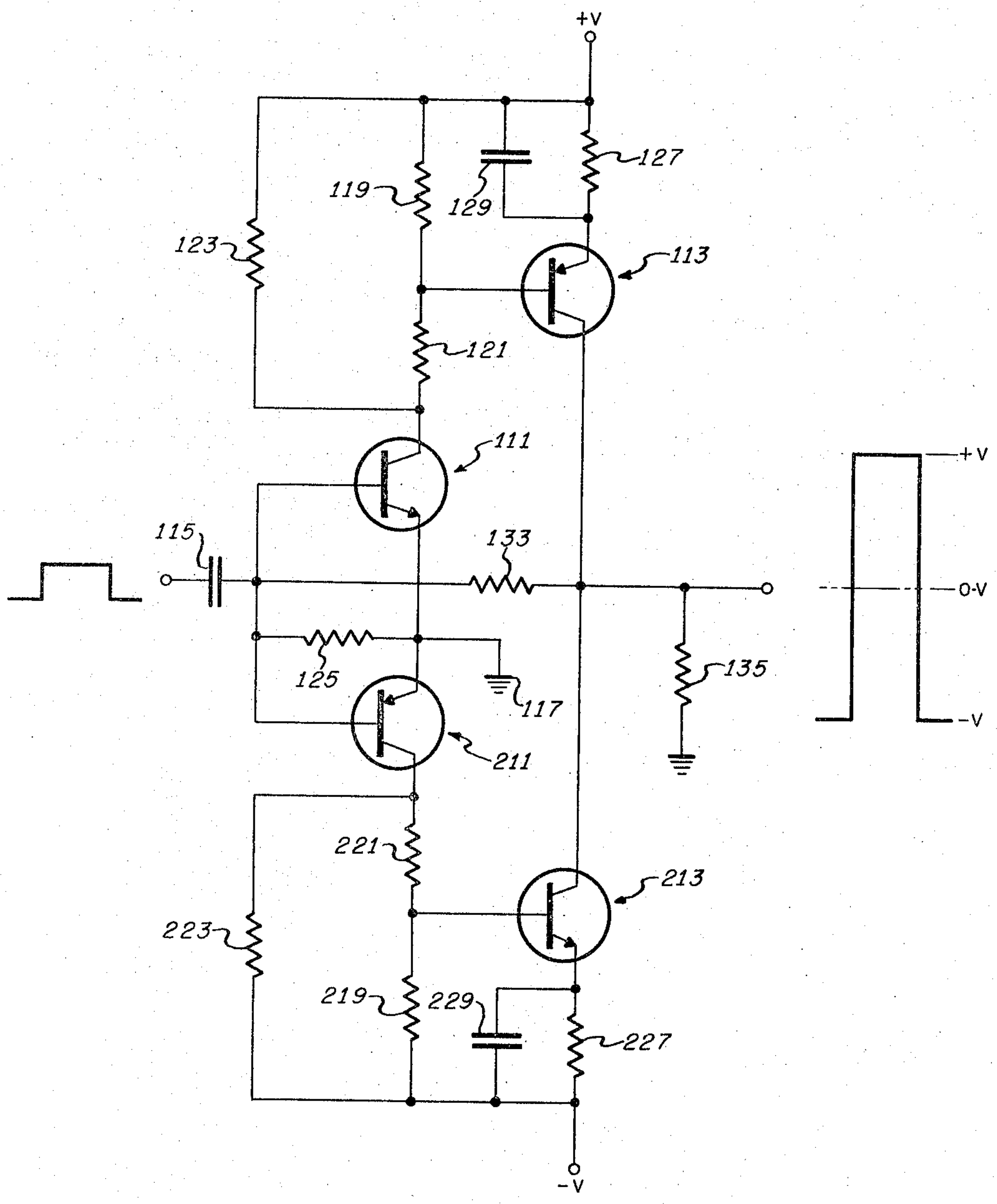

In the drawings:

FIG. 1 is a diagram illustrating a single-ended circuit employing the principles of the invention, FIG. 2 is a diagram representing various wave shapes occurring in the circuit of FIG. 1, and FIG. 3 is a diagram illustrating a push-pull circuit employing the principles of the invention.

Referring now to FIG. 1, an input n-p-n transistor 11 and an output p-n-p transistor 13 provide the switching elements for a single-ended pulse amplifier. Input signals are applied to the circuit through a blocking capacitor 15. The emitter terminal of the transistor 11 is connected directly to a ground point 17. The collector of the input transistor 11 is connected to the positive terminal of a source of collector voltage +V through a first divider resistor 19 and a second divider resistor 21 and through a shunt resistor 23.

The resistance value of the second divider resistor 21 is selected so as to limit the base current of the output transistor to an acceptable value. The resistance of the first divider resistor can then be selected to provide a bias on the base of the output transistor that will saturate this transistor when the input transistor is saturated and cut off this transistor when the input transistor is cut off.

The resistance value of the shunt resistor 23 is selected to limit the maximum collector current of the input transistor to an acceptable value.

The base of the transistor 11 is connected to ground through a base resistor 25.

The emitter of the output transistor 13 is connected to the positive source of collector voltage through an R-C network comprising an emitter resistor 27 and a bypass capacitor 29. The base of the transistor 13 is connected directly to the junction point between the resistors 19 and 21. The collector of the transistor 13 is connected to the negative terminal of the source of collector voltage −V through a collector resistor 31.

The collector voltage of the output transistor is fed back to the base of the transistor 11 through a feedback resistor 33.

An output signal is taken from the circuit across the load resistor 35.

The following circuit values, given by way of example, illustrate typical components that may be used in the circuit of FIG. 1:

| | | |
|---|---|---|
| Input transistor 11 | | 2N2219 |
| Output transistor 13 | | 2N2904 |
| First divider resistor 19 | ohms | 1300 |
| Second divider resistor 21 | do | 2200 |
| Shunt resistor 23 | do | 200 |
| Base resistor 25 | do | 510 |
| Emitter resistor 27 | do | 100 |
| Collector resistor 31 | do | 2400 |
| Feedback resistor 33 | do | 5100 |
| Load resistor 35 | do | 2000 |
| +V voltage | volts | +15 |
| −V voltage | do | −35 |

The principles of operation of the invention may be understood by referring to FIGS. 1 and 2. Assume that both transistors are initially cut off. A positive-going, rectangular input pulse is applied to the circuit. The leading edge of this input pulse produces a positive-going spike on the base electrode of the input transistor 11 as indicated in FIG. 2. This spike drives the input transistor into saturation, thereby reducing its collector voltage to a level near ground potential. This increases the base-to-emitter voltage of the output transistor 13 to a level which saturates this transistor. When the transistor 13 saturates, its collector voltage rises towards +V. This not only produces a positive output signal but also applies a positive feedback signal to the base electrode of the input transistor. This feedback signal maintains the input transistor in the saturated condition even after the input spike has disappeared. Since the input transistor 11 remains in the saturated condition during this time, a steady bias is applied to the output transistor 13 so that this transistor is also held in the saturated condition.

The trailing edge of the input pulse causes a negative-going spike to appear at the base electrode of the input transistor as shown in FIG. 2. This cuts off the input transistor, which causes its collector voltage to rise so as to drive the output transistor to cut off. When the output transistor cuts off it produces a negative output signal and also applies a feedback voltage to the base of the input transistor which is sufficient to cut off conduction in the input transistor. Since the feedback signal remains after the input spike has disappeared, each transistor holds the other in the cut off state until another positive-going input signal is received.

The shunt resistor 23 enables the circuit to switch rapidly from one stable state to the other. A certain amount of collector capacitance is necessarily associated with the input transistor. When this transistor is switched from one bistable state to the other, its collector voltage swings through a considerable range. The rate at which this voltage swing can occur is dependent upon the time constant of the collector capacitance in combination with the circuit resistance through which the charge and discharge currents must flow.

The voltage divider resistors 19 and 21 must have a relatively high value in order to limit the base current in the output transistor 13 and at the same time to provide a suitable bias for this transistor. By shunting the voltage divider with the relatively low value shunt resistor 23, ıowever, the time constant associated with the collector lectrode of the input transistor can be reduced to a low 'alue without disturbing the function of the voltage livider resistors.

The shunt resistor 23 further serves to enhance the eliability and stability of the circuit. If the input transistor 11 should deteriorate so that significant leakage :urrents pass from the collector to the emitter, these curents would tend to increase the base-to-emitter voltage of he output transistor 13. Without the shunt resistor in he circuit, this leakage current would have to pass hrough the relatively high resistance of the divider re-istors and thus cause a considerable voltage to appear ɔn the base electrode of the output transistor even when he input transistor is in its cut off condition. Because ɔf this, even a moderate amount of leakage in the input ransistor can prevent this transistor from driving the ransistor 13 to cut off.

With the comparatively low resistance-valued shunt re-istor in the circuit however, leakage current through the nput transistor has negligible effect on the voltage ap-ɔlied to the base of the output transistor. When the input ransistor is in its cut off condition, the output transistor :emains well within its cut off region.

The combination of the emitter resistor 27 and the ɔypass capacitor 29 improves the stability and speed of :he amplifier. The emitter resistor provides negative feed-ɔack which tends to compensate for changes in the circuit ɔarameters. Although this feedback reduces the gain ıssociated with the output transistor, the gain of the input ;tage is sufficient to drive the output transistor between :ut off and saturation. The bypass capacitor permits :apid switching since it effectively shorts out the emitter resistor during switching transients.

The output voltage pulses extend from a negative level determined by the output circuit impedances to a positive level which is substantially equal to the +V voltage. Since the negative level is determined by a simple resistance network and the positive level is substantially equal to the positive voltage source, the amplitude of the output voltage pulse is unusually stable.

Since a reversal of the bistable state of the circuit is triggered by a sharp current spike, the duration of the output pulse is held to a close approximation of the duration of the input signal.

Since the time constants of the circuit have been reduced to a small value, the leading and trailing edges of the output pulse are extremely steep and nearly linear.

In the embodiment shown, the output pulse is centered around a zero voltage level. It will be appreciated that this can be readily altered by varying the values of the individual resistors comprising the output impedance or the voltage of the collector supply with respect to ground.

FIG. 3 represents a push-pull circuit employing the principles of the invention. This circuit is particularly useful when a low impedance load is to be driven by the pulse amplifier.

Basically, the circuit of FIG. 3 is equal to a pair of circuits of the type illustrated in FIG. 1 arranged in a push-pull relationship.

The circuit contains an n-p-n input transistor 111 and a p-n-p input transistor 211 as well as a p-n-p output transistor 113 and an n-p-n output transistor 213. The input signal is applied to the circuit through a blocking capacitor 115. The emitters of the two input transistors are connected to a common ground 117. A first pair of divider resistors 119 and 219 and a second pair of divider resistors 121 and 221 are used to establish a bias on the base electrodes of the respective output transistors. A shunt resistor 123 is connected across the divider resistor in the upper half of the circuit and a shunt resistor 223 is connected across the divider resistor in the lower half of the circuit.

A common base resistor 125 is connected between the bases and the emitters of the two input transistors.

A pair of emitter resistors 127 and 227 are connected in series with the emitters of the output transistors. These resistors are shunted by bypass capacitors 129 and 229 respectively.

A feedback voltage is applied to the bases of the input transistors from the collectors of both output transistors through a common feedback resistor 133. The output voltage from the circuit appears across a load resistor 135.

This circuit operates in substantially the same way as the circuit of FIG. 1. In effect, the collector resistor 31 of FIG. 1 is replaced by a second output transistor 213. The circuit operates so that the transistors 111 and 113 are driven to one conductivity state at the same time that the transistors 211 and 213 are driven to the opposite conductivity state. The leading edge of a positive-going, rectangular input pulse causes a positive-going spike to appear on the base electrodes of both input transistors. This drives the transistor 111 to saturation and the transistor 211 to cut off. When the transistor 111 saturates, its collector voltage approaches ground potential and the base-to-emitter voltage on the transistor 113 increases to a value that saturates the transistor 113. When the transistor 211 is cut off, its collector voltage approaches the −V potential and the base-to-emitter voltage of the transistor 213 decreases to a value that drives the transistor 213 to cut off. With the transistor 113 saturated and the transistor 213 cut off, a feedback signal is applied to the input transistors that tends to hold the transistor 111 in the saturated state and the transistor 211 in the cut off state even after the input spike has disappeared.

The circuit remains in this binary state until the trailing edge of the rectangular input pulse causes a negative-going spike to appear on the bases of both input transistors. This reverses the conductivity state of all of the transistors thereby swithing the circuit to the opposite bistable condition.

The output voltage varies between a value substantially equal to +V when the transistor 113 is saturated and the transistor 213 is cut off, to a value substantially equal to −V when the conductivity state of these two transistors is reversed.

The shunt resistors 123 and 223 function to reduce the switching time of the circuit in the same way that the shunt resistor 23 reduces the switching time in the circuit of FIG. 1. Similarly, the R-C networks in the emitter circuits of the output transistors function to improve the switching speed and stability of the circuit in the same way that the corresponding R-C network of the circuit of FIG. 1 improves the speed and stability of that circuit.

The output voltage pulse is centered around a zero voltage level and extends substantially between the voltage levels supplied by the collector voltage source. Thus the amplitude of the input pulse is held within close limits of the design value.

Although transistors of a specific conductivity type have been described, it will be appreciated that transistors of the opposite conductivity type may be used so long as the conductivity type of each transistor in the circuit is reversed.

While the inveniton has been described in its preferred embodiments, it it is to be understood that the words which have been used are words of description rather than of limitation and that changes within the purview of the appended claims may be made without departing from the true scope and spirit of the invention in its broader aspects.

What is claimed is:

1. A pulse amplifier comprising an n-p-n input transistor connected in a grounded emitter circuit; a p-n-p input transistor connected in a ground emitter circuit; a base, a collector, and an emitter in each of said input transistors; means to apply an input pulse to the bases of both input transistors so as to drive these transistors to cut off and saturation; a source of collector voltage; a first voltage divider interconnecting the collector of the n-p-n transistor and the plus side of said collector source; a second voltage divider interconnecting the collector of the p-n-p transistor and the minus side of said source; a junction point on each of said voltage dividers; a p-n-p output transistor; an n-p-n output transistor; a base, a collector, and an emitter in each of said output transistors; said p-n-p output transistor having its base connected to the junction point on said first voltage divider; said n-p-n output transistor having its base connected to the junction point on said second voltage divider; said junction points being positioned so that the voltage supplied to the output transistor switches this transistor to the same level of conductivity as that of the corresponding input transistor; individual R-C networks connecting the emitters of the p-n-p and the n-p-n output transistors to the respective plus and minus terminals of said collector supply; an output terminal connected to the collectors of both output transistors; feedback means to conduct a portion of the voltage at said output terminal back to the bases of said input transistors; and individual shunt resistors connected across each voltage divider, said shunt resistors having a resistance low enough to permit substantially maximum permissible collector current to flow in each input transistor.

2. A push-pull pulse amplifier comprising first and second input transistors of opposite conductivity types; means to drive the first input transistor to saturation conductivity condition and the second input transistor to cut off conductivity condition in response to the leading edge of an input pulse and to drive the first input transistor to cut off conductivity condition and the second input transistor to saturation conductivity condition in response to the trailing edge of an input pulse; a first output transistor of a conductivity type opposite to that of the first input transistor; a second output transistor of a conductivity typ opposite to that of the second input transistor; each o said transistors containing input terminals and outpu terminals; a source of power; first and second voltag dividers connecting the source of power to the output ter minals of the first and second input transistors respectively junction points on said first and second voltage dividers said junction points being connected to the input terminal on said first and second output transistors respectively said junction points being positioned so as to drive eacl output transistor to the same conductivity condition as tha of the corresponding input transistor; feedback means tc insure that the input transistors remain in a given con ductivity condition until they are switched by an inpu pulse; said voltage dividers having a resistance high enougl to limit the current in the output transistors to a safe operating value; first and second shunt resistors connected across said first and second voltage dividers respectively said shunt resistors having a resistance that is low in comparison to the resistance of said voltage dividers; and a load terminal connected directly to the output terminals on both output transistors.

References Cited by the Examiner

UNITED STATES PATENTS

| | | | |
|---|---|---|---|
| 2,860,193 | 11/1958 | Lindsay | 330—17 X |
| 2,863,008 | 12/1958 | Keonjian | 330—17 |
| 3,145,308 | 8/1964 | Gindi | 307—88.5 |

ARTHUR GAUSS, *Primary Examiner.*

J. ZAZWORSKY, *Assistant Examiner.*